United States Patent
Richmond et al.

(10) Patent No.: US 7,279,925 B1
(45) Date of Patent: Oct. 9, 2007

(54) CAPACITIVE FEEDFORWARD CIRCUIT, SYSTEM, AND METHOD TO REDUCE BUFFER PROPAGATION DELAY

(75) Inventors: Greg Richmond, Sunnyvale, CA (US); Paula O'Sullivan, Co. Cork (IE)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 11/365,703

(22) Filed: Mar. 1, 2006

Related U.S. Application Data

(60) Provisional application No. 60/661,313, filed on Mar. 10, 2005.

(51) Int. Cl.
*H03K 17/16* (2006.01)
*H03K 19/003* (2006.01)
(52) U.S. Cl. .............................. 326/27; 326/26; 326/82
(58) Field of Classification Search ............ 326/26–27, 326/82–83; 327/108, 112
See application file for complete search history.

(56) References Cited

U.S. PATENT DOCUMENTS

| | | | |
|---|---|---|---|
| 5,324,999 A | | 6/1994 | Hunley et al. |
| 6,414,517 B1 | | 7/2002 | Kim et al. |
| 6,486,821 B1 | * | 11/2002 | Aude et al. .................. 341/172 |
| 2006/0145734 A1 | * | 7/2006 | Abdel-Hamid et al. ..... 327/112 |

OTHER PUBLICATIONS

BAZES, "Two Novel Fully Complementary Self-Biased CMOS Differential Amplifiers," IEEE Journal of Solid-State Circuits, vol. 26, No. 2, Feb. 1991, pp. 165-168.
Technical Note TN-46-05, "General DDR SDRAM Functionality," Micron Technology, Inc., Jul. 2001, 11 pages.

* cited by examiner

*Primary Examiner*—Anh Q. Tran
(74) *Attorney, Agent, or Firm*—Kevin L. Daffer; Daffer McDaniel, LLP

(57) ABSTRACT

A buffer circuit, system, and method are provided. The buffer circuit includes a control circuit coupled to an output of the buffer, or possibly to an output of the first stage of a buffer. A pre-charge circuit is also provided coupled to bias an input of the control circuit to a voltage value approximately near a threshold voltage of the control circuit. The pre-charge bias amount is slightly less than the amount needed to place the control circuit in a high current conduction state. A coupling circuit is thereafter used and adapted to couple an input voltage applied to the buffer circuit to the input of the control circuit. This causes the control circuit to enter the high current conduction state. Depending on the input impedance of the coupling circuit, by pre-charging the coupling circuit input, less time is needed to cause the coupling circuit to enter and thereafter leave a high current conduction state. Therefore, by pre-charging the coupling circuit, output transitions from the buffer circuit can be accelerated and propagation delay reduced. The pre-charge circuit and the control circuit operate on one or more stages of a single or multi-stage buffer, operate on single-ended or differential/complementary input/output, and operate to speed up either the rising, falling, or both edges transitions at the output of the buffer.

20 Claims, 6 Drawing Sheets

CAPACITIVE FEEDFORWARD CIRCUIT, SYSTEM, AND METHOD TO REDUCE BUFFER PROPAGATION DELAY

PRIORITY APPLICATION

The present application claims priority to U.S. Provisional Application No. 60/661,313 entitled "Capacitive Feedforward Circuit, System and Method to Reduce Buffer Propagation Delay," filed Mar. 10, 2005.

BACKGROUND OF THE INVENTION

1. Field of the Invention

The present invention relates to an electronic system and, more particularly, to a buffer circuit that utilizes a pre-charge coupling circuit and a capacitively coupled feedforward signal to reduce the propagation delay within the buffer.

2. Description of the Related Art

The following descriptions and examples are not admitted to be prior art or conventional by virtue of their inclusion within this section.

Electronic systems often use buffer circuits to receive external signals and convert those signals to appropriate voltage levels. Buffer circuits are often found in sequential electronic systems, such as those that use a regular and periodic clocking signal. Therefore, a buffer circuit can be used to receive an external clocking signal, and convert the clocking signal to an appropriate voltage level at an appropriate time. Buffer circuits preferably exhibit short delay time, often referred to as propagation delay, small skew, and low power consumption. Unfortunately, however, in order to achieve a relatively short propagation delay, most buffer circuits consume considerable power. Alternatively, the load impedance must be reduced in order to shorten propagation delay.

Increasing the power consumption by increasing current in one or more stages of a buffer circuit can reduce the charging and discharging time and, therefore, reduce propagation delay. However, the additional power consumption can be a significant penalty in the overall performance of the electronic system. Most electronic systems are constrained in the amount of power that can be consumed. Even though current might be increased to reduce propagation delay, there still remains certain intrinsic device capacitances on the various nodes of the buffer circuit which will ultimately limit propagation delay, even though power consumption is quite high.

It would be desirable to minimize propagation delay within the buffer circuit, no matter how many stages, or whether the buffer circuit utilizes differential or single-ended inputs and outputs. The desired buffer circuit having decreased propagation delay must be one that does not suffer the burden of increasing current within the buffer and the ultimate detriment of increased power consumption. Moreover, the desired buffer circuit is one that has reduced propagation delay without having to reduce the load to which the buffer circuit is connected.

SUMMARY OF THE INVENTION

The problems outlined above are in large part solved by a buffer circuit that can forward an input signal to a control circuit that is pre-charged near a threshold voltage of that control circuit. The input signal can be capacitively coupled as a feedforward signal to the control circuit. The control circuit is pre-charged using a pre-charge circuit coupled between the output of the buffer and the input of the control circuit.

The pre-charge circuit is one that can switchably place a voltage approximately near the threshold voltage of the control circuit immediately preceding the transitional edge of the feedforward signal (i.e., feedforward voltage) that is then capacitively coupled to the control circuit. Thus, the control circuit is pre-conditioned to a charge so that it can rapidly turn on to a high current state whenever the input signal is present. When the input signal is absent, the pre-charge circuit will discharge the control circuit input either to a power supply or ground supply, depending on whether the buffer is to capacitively couple a rising edge or a falling edge input signal.

The buffer can comprise a single stage buffer, or two (or more) inverting stages. Moreover, the buffer can accommodate differential inputs and differential outputs, or a single-ended input and a single-ended output. The control circuit, pre-charge circuit, and coupling circuit can be used to capture the rising edge, capacitively couple the rising edge to the control circuit, and pre-charging the control circuit on the previous falling edge. Alternatively, the control circuit, pre-charge circuit, and coupling circuit can be used to capacitively couple a falling edge, and the pre-charge circuit can be used to pre-charge the control circuit during the previous rising edge of the input signal. Still further, the control circuit, pre-charge circuit, and coupling circuit can be capacitively coupled to both the falling and rising edges in order to reduce the propagation delay on both those edges within the buffer.

BRIEF DESCRIPTION OF THE DRAWINGS

Other objects and advantages of the invention will become apparent upon reading the following detailed description and upon reference to the accompanying drawings in which.

Figure 1:
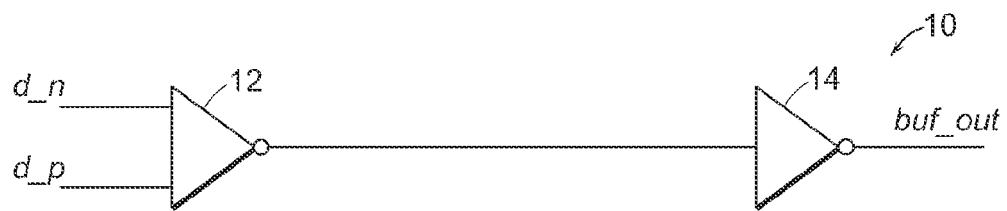
FIG. 1 is a circuit schematic of a buffer circuit.

While the invention is susceptible to various modifications and alternative forms, specific embodiments hereof are shown by way of example in the drawings and will herein be described in detail. It should be understood, however, that the drawings and detailed description thereto are not intended to limit the invention to the particular form disclosed, but on the contrary, are intended to cover all modifications, equivalents, and alternatives falling within the spirit and scope of the present invention as defined by the appended claims.

DETAILED DESCRIPTION OF PREFERRED EMBODIMENTS

Turning now to the drawings, FIG. 1 illustrates a two-stage input buffer architecture 10 having a first stage 12 and a second stage 14. The first stage 12 can have differential inputs d_n and d_p, and a single inverted output. The second stage 14 can be either a single-ended input and single-ended output (as shown) or a differential input and differential output. It is recognized that the term "buffer" can include a single stage, two stages, or more than two stages, and the buffer can comprise differential (or complementary) inputs and outputs or a single-ended input and a single-ended output, or combinations thereof.

As used herein, the term "differential" refers to a pair of signals, wherein one signal is the logic state complementary of the other. In other words, if there is a differential input or differential output, the corresponding input and output comprise two conductors, and each conductor bears one of the complementary pair of signals. Thus, if the buffer has a differential input, then as one input transitions to the logic high voltage value, the other signal transitions to the logic low voltage value. The same can be said for a differential output. Conversely, a single-ended input and a single-ended output do not use differential signals, but only a single signal that transitions between the logic low and logic high voltage values. The signal can be a sine wave, a square wave, or any wave that periodically repeats the transitions between the logic high and logic low voltage values.

Figure 2:
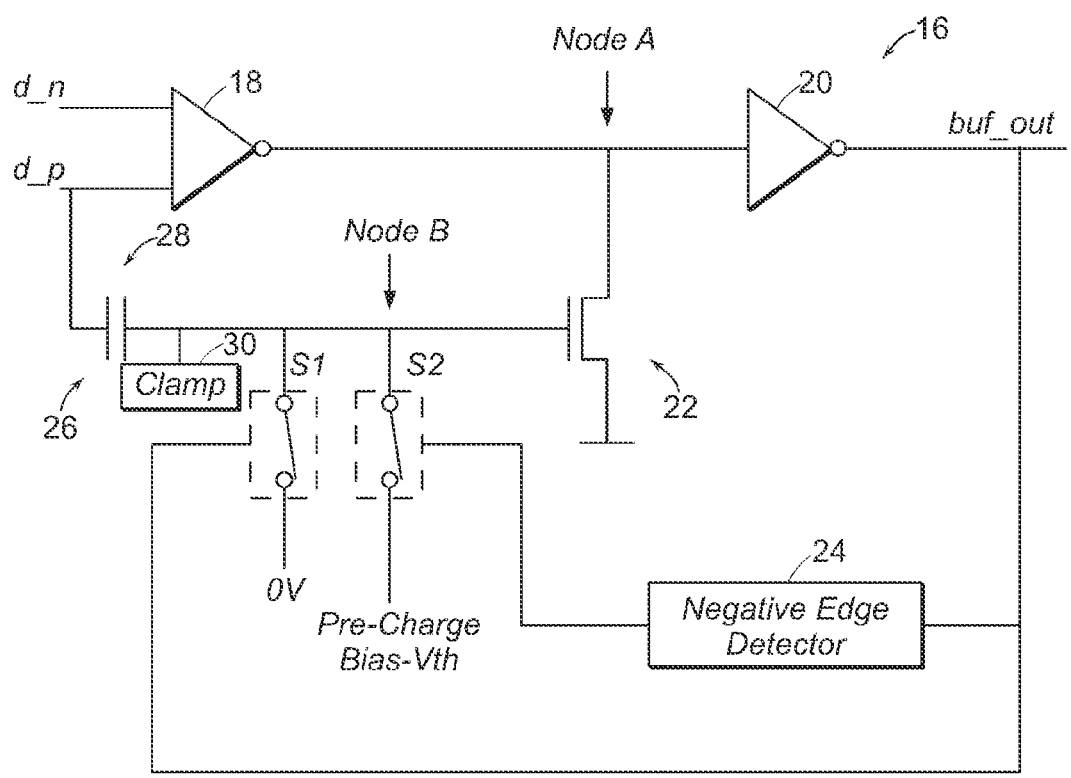
FIG. 2 is a circuit schematic of a buffer circuit that utilizes a rising edge, capacitively coupled feedforward signal to reduce rising edge propagation delay within the buffer.

FIG. 2 illustrates an exemplary buffer 16 having two inverting stages 18 and 20. The positive input signal or rising edge input signal is capacitively fed forward to the control circuit 22. Control circuit 22 might comprise simply a transistor and, more specifically, an NMOS transistor. If a single transistor is used, control circuit 22 can be thought of as having a "helper" transistor that is pre-charged to a DC level close to its threshold voltage. Thus, if the threshold voltage is 0.7 volts, a pre-charge circuit 24 charges via switch S2 the input of control gate 22 near 0.7 volts and, preferably, slightly less than 0.7 volts and, more preferably, within for example 0.05-0.1 volts less than the 0.7 volts threshold if this example is to be used. The threshold voltage value is simply the minimum gate voltage necessary for onset of current flow between the source and drain of an insulated-gate field-effect transistor (IGFET) or a metal oxide semiconductor transistor (MOS). For an NMOS transistor, the threshold voltage is approximately $V_T$ above the ground supply or 0 volt. For a PMOS transistor, the threshold voltage is a value less than $V_{DD}$-$V_T$.

Capacitive coupling occurs through a coupling circuit 26. Coupling circuit 26 can include a feedforward capacitor 28 and a clamp or limiting circuit 30. Capacitor 28 operates somewhat as a high-pass filter by forwarding transient voltage values onto the limiting circuit 30. By quickly forwarding any transient voltage values at the input onto node B (FIG. 2), capacitive feedforward has minimal delay if any. Any DC values on which the transient resides are blocked and the instantaneous changes or transitions rapidly appear in the desired feedforward architecture. Limiting circuit 30 removes any spurious noise beyond a clamped value, and the combination of capacitor 28 and clamp 30 of coupling circuit 26 provides a feedforward voltage from the positive terminal of the differential input. Clamp 30 can be formed in numerous ways. For example, the clamp can be formed from a diode which is forward-biased whenever, for example, the voltage exceeds a predetermined amount. That amount can be produced either from a separate supply voltage or through a resistor-divider network. If, for example, a symmetrical clamp is needed, then two diode clamps can be configured—one of which forward biases to the maximum voltage level, and the other forward biases to the minimum voltage level. Using a symmetrical clamp, whatever voltages on the input that exceed the clamped amount will not appear upon node B.

The feedforward voltage is effectively applied to the gate of a transistor, such as an NMOS transistor, whose source terminal is coupled to a ground supply. In the prior cycle of the non-inverted input (d_p), the input is at a logic low voltage value that is detected by control circuit 24, having a negative edge detector. The transient falling edge, or negative edge, is used to control switch S2 which applies a bias voltage slightly less than the threshold value of transistor 22 whenever the non-inverted input is at a low logic value. In the next transition, when the non-inverted input transitions from a logic low state and assumes a rising edge, the rising edge is capacitively fed forward by coupling circuit 26 and added to the pre-existing bias voltage at the input of control circuit 22 to cause circuit 22 to turn on into a high current state and, thus, drop the voltage at node A. The voltage node A would normally drop whenever the non-inverted input (d_p) transitions on a rising edge; however, by pre-charging the input of control circuit 22, the negative edge appears much faster at node A than in the normal circumstance. This will cause the inverted output (buf_out) to propagate a rising edge much earlier than conventional buffer circuits.

The example of FIG. 2 is that of a buffer circuit 16 that is used to reduce the delay on a rising edge (when d_p transitions high and the inverted input d_n transition low). Buffer circuit 16 can also be used and applied to a falling edge transition, or both the rising and falling edges by simply replicating the circuit, as will be described later.

Details of the FIG. 2 circuit are that the buffer circuit 16 can be used as a clock buffer, with alternating high and low signals at the input of the clock circuit. One example of such differential input is in a double data rate (DDR) clock engine. Buffer 16 output is low after a negative edge which causes switch S1 to open and, via switch S2 being closed, the bias voltage to be applied to control circuit 22. When a negative edge is detected at buffer output, switch S2 is closed for a short period of time controlled by the negative edge detector of pre-charge circuit 24. The duration of this pulse must be sufficient to pre-charge the input of the control circuit 22, alternatively referred to as a "helper transistor" at node B, to a voltage near but slightly less than the threshold voltage of the helper transistor. Negative edge detector 24, and edge detection in general, can be effectuated in numerous ways. For example, a leading edge, whether the edge is a rising edge (positive edge) or a falling edge (negative edge), can be determined using a differentiator. The simplest form of a differentiator is an RC differentiator that can generate a predefined voltage value at the transition of an input signal. That predefined voltage value is then sent to switch S2.

Switch S2, similar to switch S1, can be made from a transistor, and the predefined voltage value output from the edge detector will have sufficient voltage to produce the onset of current flow between source and drain nodes of that transistor. This will in effect couple the bias voltage from the source onto the drain which is coupled at node B. While edge detector 24 may produce a positive predefined voltage value when a negative edge is detected, the input to detector 24 can also be forwarded to switch S1 so that once the input transitions to a positive edge, the output from detector 24 will transition low, yet the high-transition input will cause switch S1 to be active and to place the 0 volt value ($V_{SS}$) or ground supply to node B after the bias is no longer applied due to switch S2 being open.

The helper transistor can be a weak pull-down transistor, properly sized with an appropriate channel length. The input signal from d_p is capacitively coupled onto the gate of the helper transistor. The rising edge occurs on d_p and is capacitively coupled onto the gate of the helper transistor, and this pulls the helper transistor above its threshold voltage. The helper transistor turns on and starts the pull down of node A. The pre-biasing assists the pull down of node A by the first stage 18, and reduces the propagation delay between input and output for a rising input edge. When buffer output is high, switch S1 is closed. This pulls the gate of the helper transistor (node B) low. Thus, when the output is high, the negative edge detector does not cause switch S2 to close, but instead the output buffer high voltage value causes switch S1 to close, and pulls node B down to a low voltage value to turn off the helper transistor when a negative input edge at d_p will occur next. In some applications, there may be a considerable range of input signals swings. Therefore, the clamping circuit 30 may be required to limit the magnitude of voltage on the helper transistor gate for larger signal swings.

The input stage can be a differential input stage and can use true input. However, FIG. 2 can be modified and applied with different logic to complementary input. The first stage can either be a differential first stage or can be a single-ended first stage. Moreover, as will be described below, instead of two stages, the buffer circuit can be a single stage.

Figure 3:
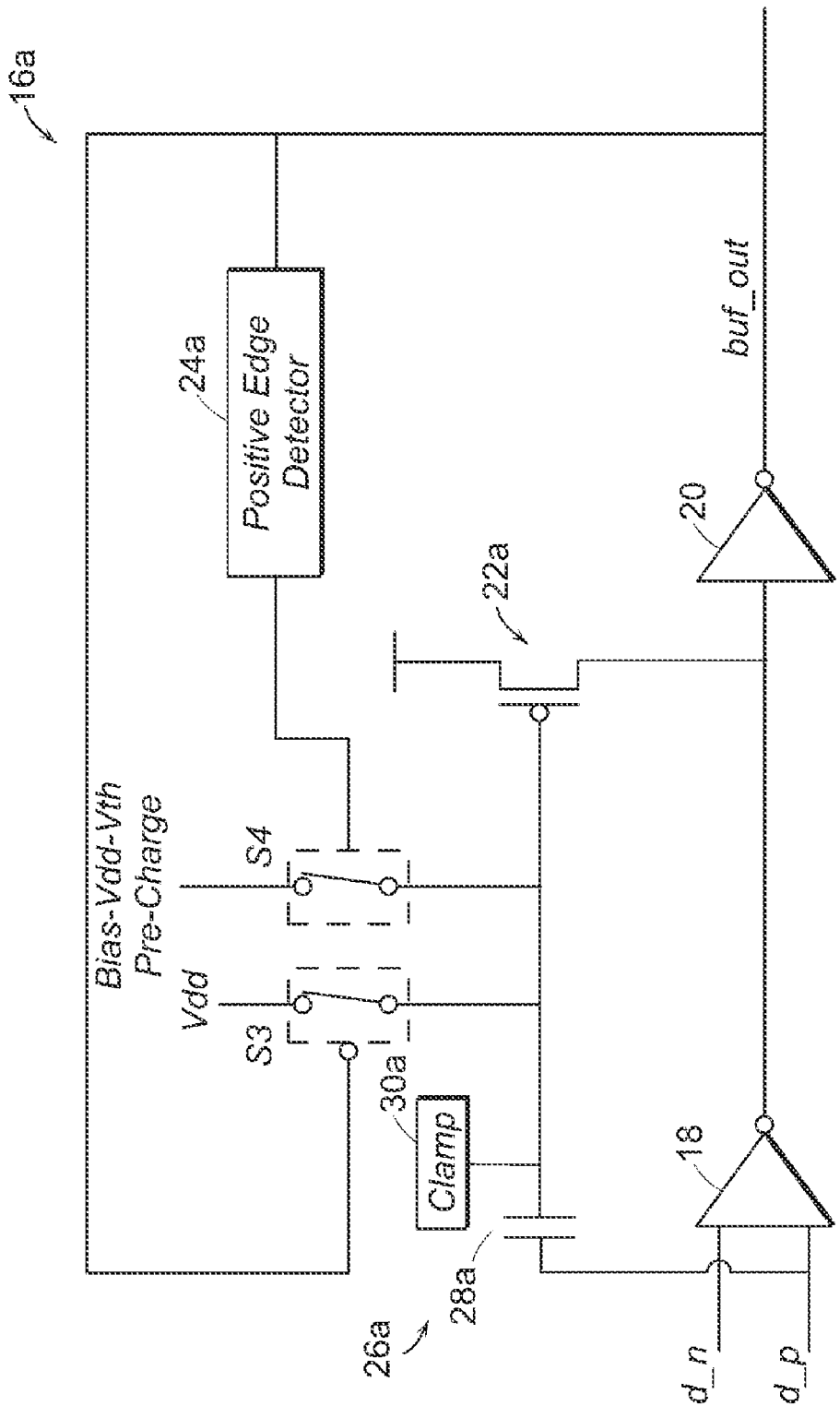
FIG. 3 is a circuit schematic of a buffer circuit that utilizes a falling edge, capacitively coupled feedforward signal to reduce falling edge propagation delay within the buffer.

Referring to FIG. 3, an alternative construction is shown for reducing the falling edge delay. Contrary to FIG. 2 which reduces the rising edge delay, FIG. 3 is shown having a first stage 18 and a second stage 20 of buffer circuit 16a. A pre-charge circuit 24a includes a positive edge detector coupled to the buffer 16a output to control switch S4, which biases the input to control circuit 22a whenever a positive edge is detected at the buffer output. The positive edge detector 24a operates similar to the negative edge detector 24 of FIG. 2, in that an edge is detected and the appropriate voltage value is placed on the output of detector 24a representative of that detected voltage. The output voltage is produced at the moment the rising (positive) edge is detected. The output from detector 24a will cause switch S4 to place the bias voltage upon the input of control circuit 22a whenever the positive edge is detected. Conversely, whenever the positive edge no longer exists and a negative edge occurs, switch S3 will place the power supply voltage at the input to control circuit 22a. Control circuit 22a can be produced from a PMOS transistor, rather than the NMOS transistor of control circuit 22 (FIG. 2).

The bias voltage is preferably slightly more than a power supply voltage minus a voltage threshold. When a negative edge is detected, switch S3 is activated to pull the input to control circuit 22a to a power supply voltage and, thus, turn off control circuit 22a. Similar to feedforward capacitor 28 and clamping circuit 30 of coupling circuit 26 in FIG. 2, FIG. 3 contains the same components labeled as 28a, 30a, and 26a, respectively. By pre-biasing or pre-charging the input to control circuit 22a, a falling edge on d_p will be capacitively coupled to the pre-charged voltage which is slightly above the power supply voltage (Vdd) minus the threshold voltage (Vth), to turn on control circuit 22a to a high current state and, thus, form a pull up on the input of the second stage 20. Thus, the output of buffer 16a will transition to a falling edge much quicker using the buffer circuit 16a.

Figure 4:
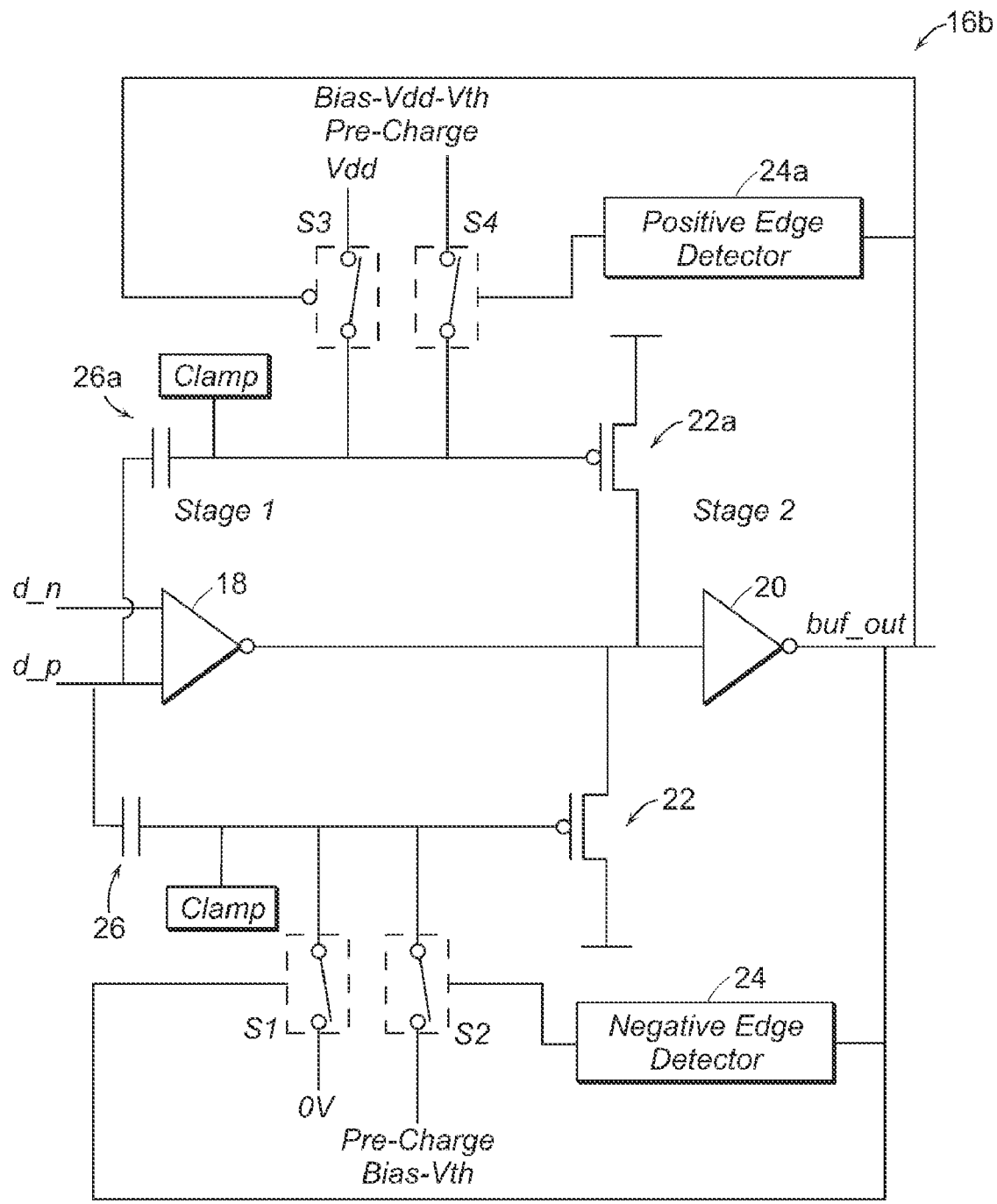
FIG. 4 is a circuit schematic of a buffer circuit that utilizes both rising and falling edge, capacitively coupled feedforward signals to reduce rising and falling edge propagation delays within the buffer.

FIG. 4 illustrates yet another alternative construction, in which both the rising and falling edges can be initiated much sooner. By replicating the circuits of FIGS. 2 and 3 with pre-charge circuits 24 and 24a, and coupling both the negative and positive (falling and rising) edges at the input d_p onto the pre-charge nodes, both the rising and falling edges can occur much sooner and, thus, the overall propagation delay at both edges of buffer 16b can be reduced.

Figure 5:
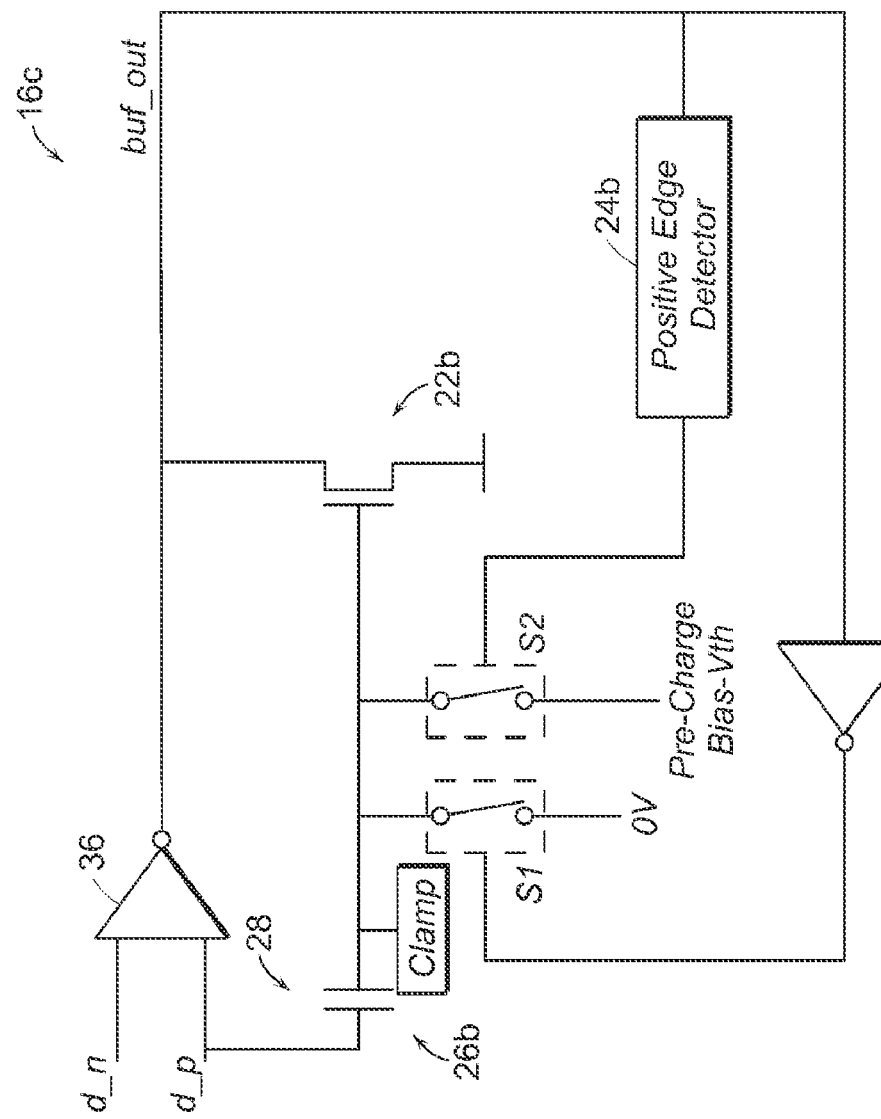
FIG. 5 is a circuit schematic of a single stage buffer circuit that utilizes a rising edge, capacitively coupled feedforward signal to reduce rising edge propagation delay within the buffer.

FIG. 5 illustrates use of only a single-stage amplifier instead of the two-stage amplifiers shown in FIGS. 2-4. A single-stage differential or single-ended amplifier with inverted output 36 is shown. Like the circuit of FIG. 2, the single-stage buffer circuit 16c has a pre-charge circuit 24b, control circuit 22b, and coupling circuit 26b. The components 22b, 24b, and 26b are similar to components 22, 24, and 26 in FIG. 2. The only difference between FIGS. 2 and 5 is that the output (buf_out) is inverted. Nonetheless, FIG. 5 provides a reduction of delay on a rising edge of d_p, similar to FIG. 2, yet does so using single-stage 36.

According to the various embodiments shown, either propagation delay of a rising edge, a falling, or both can be reduced. Reductions in propagation delay are carried out by pre-charging, for example, the gate of a pull up/pull down transistor combined with a capacitive feedforward of an input transistor. This will speed up early transition of either an output node or a node at the output of a first stage of a two-stage buffer. For double data rate registers, low propagation delay is key to clock signaling. The simulation output at FIG. 6 indicates that approximately 165 ps improvement in propagation delay for either a rising or falling edge can be achieved using the circuits of FIGS. 2-5.

Figure 6:
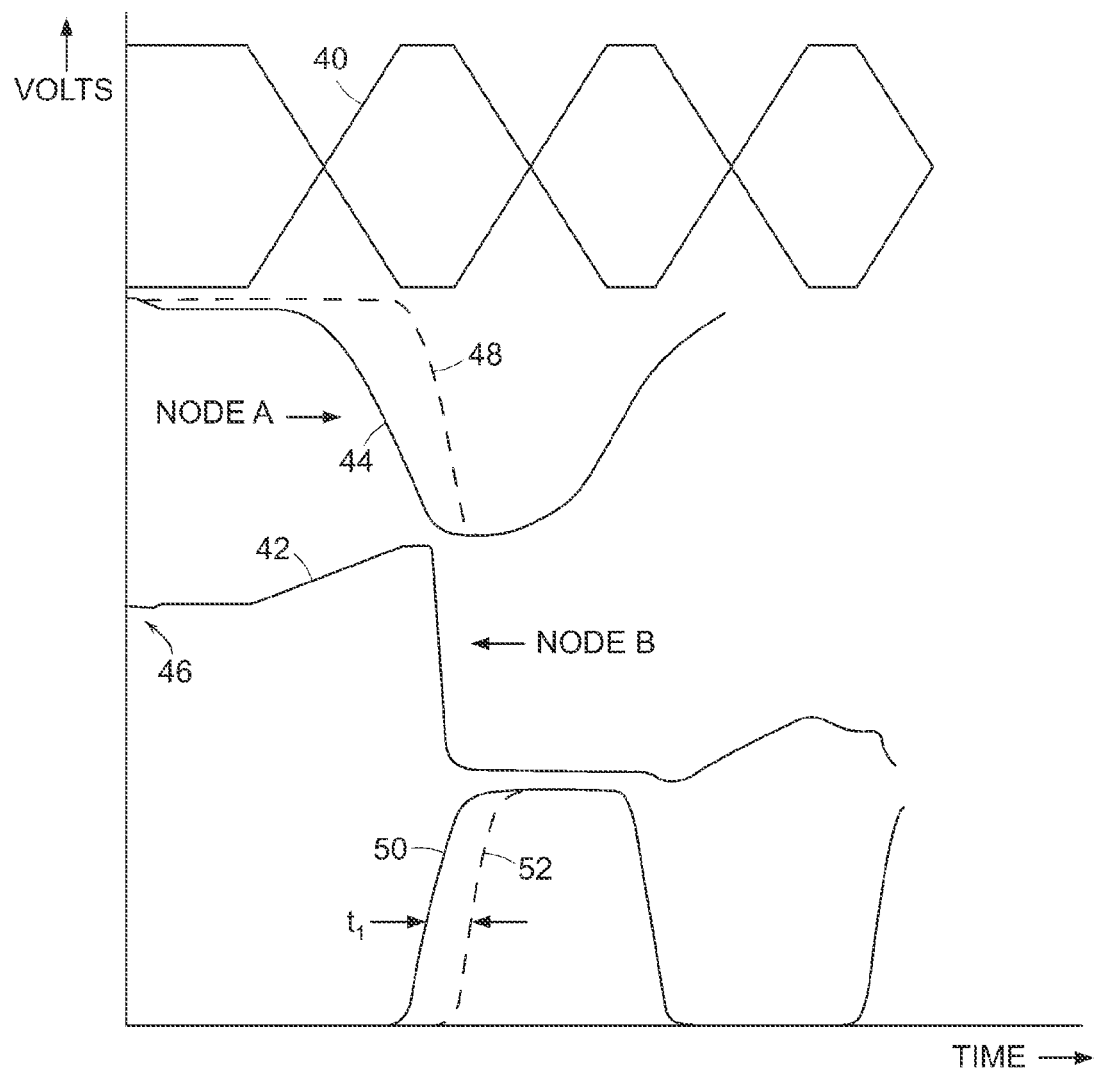
FIG. 6 is a graph of simulation results taken of propagation delay improvement utilizing the circuit of FIGS. 2-5.

As shown in FIG. 6, as the input d_p transitions at a rising edge 40, the capacitive feedforward causes the voltage at node B (FIG. 2) to rise 42. Once the voltage exceeds a threshold of a control circuit 22 (FIG. 2), node A begins to drop 44 to a logic low voltage value. By pre-charging node B at an initial voltage value 46 near the threshold of the control circuit, any capacitive feedforward of a small quantity will cause node A to drop since control circuit 22 has become active. That drop in voltage is advanced in time relative to when node A would normally drop if there were not a control circuit involved, as shown by dashed line 48. Because node A transitions more quickly through use of the helper transistor, the output from buffer 16 (FIG. 2) will transition at a rising edge 50 much sooner than it would absent the helper transistor, as shown by dashed line 52. The advance in output transition and the overall improvement in propagation delay for a rising buffer output can also be simulated and equally correspond to a falling edge. The propagation delay improvement is shown by time $t_1$ and in the simulation results is approximately 165 ps.

Figure 7:
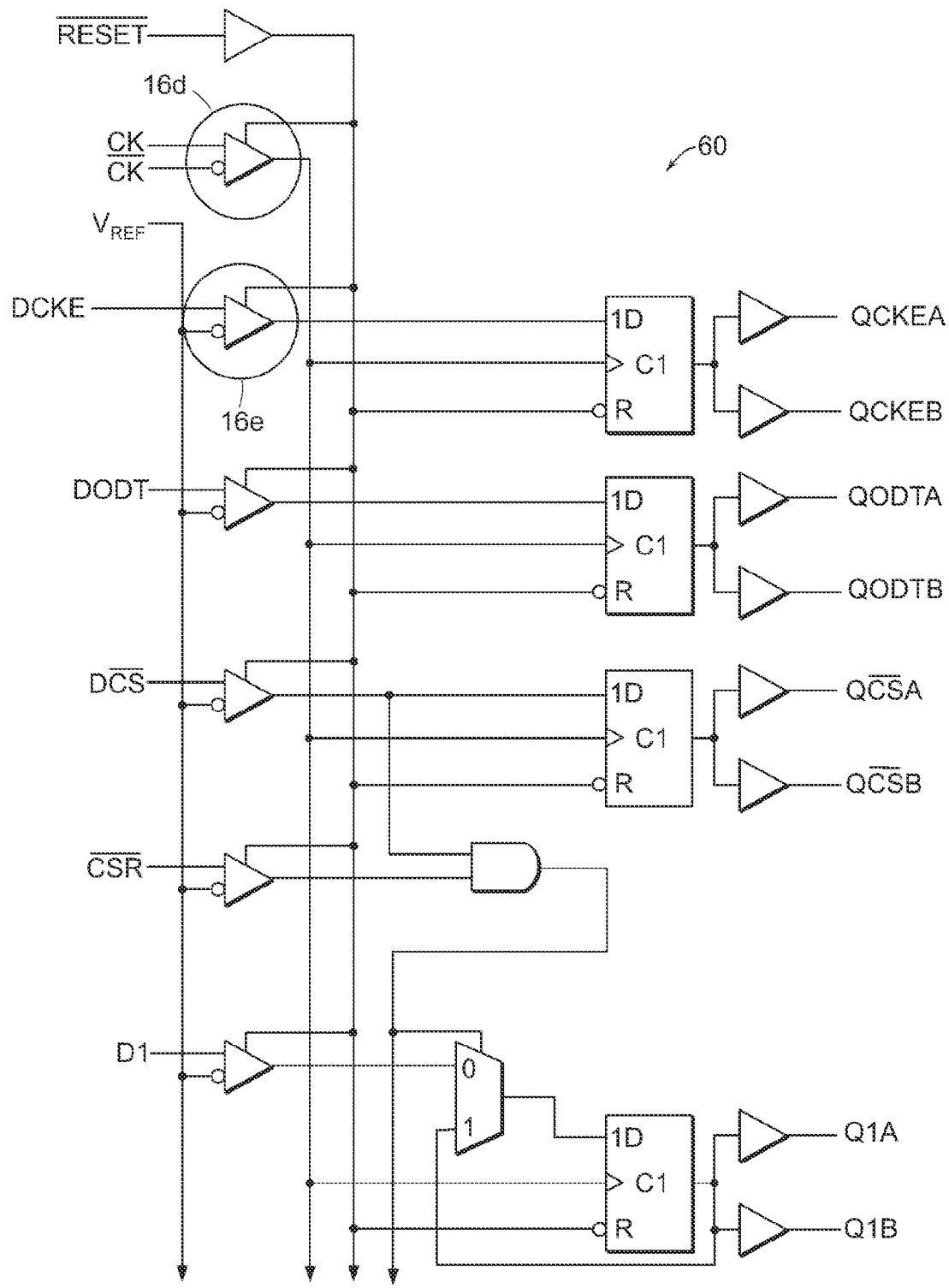
FIG. 7 is a circuit schematic of the improved buffer circuit utilized in a double data rate (DDR) clocking system, according to one application example.

FIG. 7 illustrates the buffer circuit applied to a double data rate (DDR) clocking system as an input buffer. The example application can be a double data rate (DDR2) register chip. The input signals to the part are SSTL input voltage levels. The input buffer must translate the SSTL input voltage levels to 1.8V CMOS levels, and also must ensure that the input signal had a sufficiently fast rise and fall times when applied to the CMOS core of the chip. This can be used anywhere propagation delay is an issue. For example, the input buffer can be used in block to block transfer inside a chip.

In the DDR2 register, a critical parameter of the part is the time from the rising edge of clock at the clock input buffer to the change in output signal Q at the output of the part. The total propagation delay of the is the sum of the delays through the clock input buffer, the delay from the clock to Q of the flip flop, and the propagation delay of the output buffer. Therefore, to minimize the overall delay of the whole path, the delay through each element must be minimized. To minimize the delay of the data path, it would be of benefit to minimize any delay of the data so that the data is present on the capture circuits or flip-flops 60, and that the clocking signal used to forward that data also arrives more quickly than in conventional designs. Thus, the DDR true and complementary clock signals can be buffered 16*d*. Moreover, the data can also be buffered 16*e*. Buffers 16*d* and 16*e* are similar to the buffers shown in FIGS. 2-5. In order to enhance the overall speed of the DDR memory control circuit, various data interface signals and clocking signals can each have the improved buffer configuration and architecture shown herein.

The various circuit features set forth in the present disclosure are not to be interpreted as reflecting all possible features of the claimed invention. For example, capacitive feedforward can be taken from either of the differential inputs (i.e., d_p or d_n). If capacitive feedforward occurs from d_n instead of d_p, then the logic of the switches can be easily changed. Moreover, it is contemplated that d_n can be used for one edge and d_p can be used of the other edge. If a single ended input is used, then only that input need be tapped. The specification and drawings are, therefore, to be regarded in an illustrative rather than a restrictive sense.

What is claimed is:

1. A buffer circuit, comprising:
    a first stage coupled to a second stage;
    a control circuit coupled to an output of a first stage and an input of the second stage;
    a pre-charge circuit coupled between an output of the second stage and an input of the control circuit to bias the input of the control circuit to a voltage value approximately near a threshold voltage of the control circuit; and
    a coupling circuit coupled between an input the first stage and an input of the control circuit to couple an input voltage applied to the buffer circuit to the input of the control circuit to advance an output transition from the buffer circuit.

2. The buffer circuit as recited in claim 1, wherein the coupling circuit comprises a clamp circuit for limiting the amount of input voltage coupled to the input of the control circuit.

3. The buffer circuit as recited in claim 1, wherein the control circuit comprises a transistor coupled to a ground supply.

4. The buffer circuit as recited in claim 1, wherein the control circuit comprises a transistor coupled to a power supply.

5. The buffer circuit as recited in claim 1, wherein the coupling circuit comprises a capacitor for blocking DC values within the input voltage from being coupled to the input of the control circuit.

6. The buffer circuit as recited in claim 1, wherein the pre-charge circuit comprises a first switch and a second switch, wherein the first switch is coupled to a ground supply and controlled by the output of the second stage, and wherein the second switch is coupled to a biasing voltage approximately near the threshold voltage of the control circuit and controlled by a negative edge detector coupled between the second switch and the output of the second stage.

7. The buffer circuit as recited in claim 1, wherein the pre-charge circuit comprises a first switch and a second switch, wherein the first switch is coupled to a power supply and controlled by the output of the second stage, and wherein the second switch is coupled to a biasing voltage approximately near the threshold voltage of the control circuit and controlled by a positive edge detector coupled between the second switch and the output of the second stage.

8. The buffer circuit as recited in claim 1, further comprises single-ended or differential inputs applied to the first stage, and single-ended or complimentary outputs produced from the second stage, with two control circuits, two pre-charge circuits and two coupling circuits coupled between at least one of each input and at least one of each output.

9. The buffer circuit as recited in claim 1, wherein the pre-charge circuit is coupled to periodically bias the input of the control circuit to a voltage value just below a relatively high current conduction state of the control circuit, and wherein the coupling circuit is coupled to periodically bias the input of the control circuit to a voltage value above a relatively high current conduction state of the control circuit.

10. The buffer circuit as recited in claim 1, wherein the pre-charge circuit is coupled to periodically bias the input of the control circuit to a voltage value just below a relatively high current conduction state of the control circuit, and wherein the coupling circuit is coupled to periodically bias the input of the control circuit to a voltage value below a relatively high current conduction state of the control circuit.

11. A buffer circuit, comprising:
    a control circuit coupled to an output of the buffer;
    a pre-charge circuit coupled to an input of the control circuit to bias the input of the control circuit to a voltage value approximately near a threshold voltage of the control circuit; and
    a coupling circuit adapted to couple an input voltage applied to the buffer circuit to the input of the control circuit to accelerate an output transition from the buffer circuit.

12. The buffer circuit as recited in claim 11, wherein the pre-charge circuit comprises a first and a second switch, and wherein the first switch is coupled to a ground supply and controlled by the output of the buffer and the second switch is coupled to a biasing voltage approximately near one threshold voltage above the ground supply voltage and controlled by an edge detector coupled between the second switch and the output of the buffer.

13. The buffer circuit as recited in claim 12, wherein the edge detector produces a logic state transition upon detecting a rising or falling edge at the output of the buffer.

14. The buffer circuit as recited in claim 11, wherein the pre-charge circuit comprises another first and another second switch, and wherein the another first switch is coupled to a power supply and controlled by the output of the buffer and the another second switch is coupled to a biasing voltage approximately near one threshold voltage below the power supply voltage and controlled by an edge detector coupled between the another second switch and the output of the buffer.

15. The buffer circuit as recited in claim 14, wherein the edge detector produces a logic state transition upon detecting a rising or falling edge at the output of the buffer.

16. The buffer circuit as recited in claim 11, further comprises single-ended or differential inputs applied to the buffer, and single-ended or complimentary outputs produced from the buffer, with two control circuits, two pre-charge circuits, and two coupling circuits coupled between at least one of each input and at least one of each output.

17. A method for lessening the time at which an output of a buffer transitions, comprising:
  biasing a gate of a transistor near a threshold of that transistor upon receiving an output transition from the buffer; and
  coupling an input transition into the buffer and upon the gate to activate the transistor conductive path between a power supply or ground supply, and the output of at least one stage of the buffer before the output of the buffer transitions to the power supply or ground supply, respectively.

18. The method as recited in claim 17, wherein said biasing comprises:
  detecting the output transition from the buffer; and
  selectively coupling a bias voltage to the output of at least one stage of the buffer when the output transition from the buffer changes from a first logic state to a second logic state opposite the first.

19. The method as recited in claim 17, wherein said biasing comprises:
  detecting the output transition from the buffer; and
  selecting coupling a power supply or ground supply to the output of at least one stage of the buffer when the output transition from the buffer changes from a first logic state to a second logic state opposite the first.

20. The method as recited in claim 17, wherein said coupling comprises low-pass filtering the input transition and clamping the extents of the input transition.

* * * * *